(12) United States Patent
Kelaher et al.

(10) Patent No.: US 10,368,455 B2
(45) Date of Patent: Jul. 30, 2019

(54) LIFT HANDLES HAVING SAFETY INTERLOCKS FOR A RACK-MOUNTED ENCLOSURE

(71) Applicant: International Business Machines Corporation, Armonk, NY (US)

(72) Inventors: Daniel P. Kelaher, Holly Springs, NC (US); Glenn E. Myrto, Holly Springs, NC (US); John P. Scavuzzo, Cary, NC (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 14 days.

(21) Appl. No.: 14/859,191

(22) Filed: Sep. 18, 2015

(65) Prior Publication Data
US 2016/0014918 A1  Jan. 14, 2016

Related U.S. Application Data

(62) Division of application No. 14/148,540, filed on Jan. 6, 2014, now abandoned.

(51) Int. Cl.
*H05K 5/00* (2006.01)
*H05K 5/02* (2006.01)
(Continued)

(52) U.S. Cl.
CPC ........... *H05K 5/023* (2013.01); *H05K 5/0208* (2013.01); *H05K 5/0221* (2013.01);
(Continued)

(58) Field of Classification Search
CPC .... H05K 5/023; H05K 5/0208; H05K 5/0221; H05K 7/1485; H05K 7/1487; H05K 7/1488
(Continued)

(56) References Cited

U.S. PATENT DOCUMENTS 2,032,109 A * 2/1936 Bolesky ............... E05D 3/06
16/363
3,113,651 A  12/1963 Szabo
(Continued)

FOREIGN PATENT DOCUMENTS

DE  102009038160 A1  2/2010

OTHER PUBLICATIONS

Kelaher et al., U.S. Appl. No. 14/859,159, filed Sep. 18, 2015.
(Continued)

*Primary Examiner* — Janet M Wilkens
(74) *Attorney, Agent, or Firm* — Zilka-Kotab, P.C.

(57) ABSTRACT

According to one embodiment, a system includes an enclosure configured to be removable from a rack system, the enclosure including at least one bay for insertion of a component therein, a horizontally-oriented upper wall, a horizontally-oriented lower wall, two vertically-oriented sidewalls coupled to the upper and lower walls, and a set of integrated handles, each handle being configured to transition from a recessed position to an extended position, and each handle being configured to be gripped by a hand when in the extended position, wherein each handle is configured to extend higher than the upper wall of the enclosure when in the extended position, and wherein each handle is configured to retract to within an outer profile of the enclosure when in the recessed position. Each handle is configured to rotate 180° from the recessed position to the extended position.

9 Claims, 8 Drawing Sheets

(51) Int. Cl.
 *H05K 7/14* (2006.01)
 *H05K 7/18* (2006.01)
(52) U.S. Cl.
 CPC ......... *H05K 7/1485* (2013.01); *H05K 7/1487* (2013.01); *H05K 7/1488* (2013.01); *H05K 7/18* (2013.01)
(58) Field of Classification Search
 USPC ............ 312/223.2, 244, 221, 216, 222, 215, 312/332.1
 See application file for complete search history.

(56) References Cited

U.S. PATENT DOCUMENTS

| | | | |
|---|---|---|---|
| 3,259,086 A * | 7/1966 | Stein | F23M 5/06 |
| | | | 110/340 |
| 3,261,053 A * | 7/1966 | Lesher | B65D 3/30 |
| | | | 16/445 |
| 3,447,195 A | 6/1969 | Bush | |
| 3,572,870 A | 3/1971 | Marks et al. | |
| 3,744,864 A | 7/1973 | Schmitz | |
| 4,014,598 A | 3/1977 | Stalley et al. | |
| 4,095,711 A * | 6/1978 | Conley | B65D 25/2841 |
| | | | 16/405 |
| 4,288,138 A | 9/1981 | Berry et al. | |
| 4,760,220 A | 7/1988 | Fritsch et al. | |
| 5,005,255 A * | 4/1991 | Pare | B65D 25/2841 |
| | | | 16/429 |
| 5,424,911 A | 6/1995 | Joyner et al. | |
| 5,530,620 A | 6/1996 | Sangveraphunsiri | |
| 5,553,355 A * | 9/1996 | Baty | A47B 95/02 |
| | | | 16/415 |
| 5,642,256 A | 6/1997 | Pugh et al. | |
| 5,931,550 A | 8/1999 | Chen | |
| 6,021,047 A | 2/2000 | Lopez et al. | |
| 6,123,203 A | 9/2000 | Gibbons | |
| 6,227,101 B1 | 5/2001 | Rabadi et al. | |
| 6,426,876 B1 | 7/2002 | Shearman et al. | |
| 6,449,171 B1 * | 9/2002 | Karnes | H05K 5/023 |
| | | | 16/110.1 |
| 6,484,364 B2 | 11/2002 | Turner | |
| 6,575,493 B1 | 6/2003 | Lowenstein | |
| 6,616,252 B2 | 9/2003 | Clements et al. | |
| 6,802,108 B2 | 10/2004 | Haselby et al. | |
| 7,542,300 B1 | 6/2009 | Lui et al. | |
| 7,574,771 B2 * | 8/2009 | Cheng | G06F 1/18 |
| | | | 16/114.1 |
| 7,804,690 B2 | 9/2010 | Huang et al. | |
| 8,016,370 B2 | 9/2011 | Grainger | |
| 8,070,242 B2 | 12/2011 | Makabe | |
| 8,579,393 B2 * | 11/2013 | Song | G06F 1/181 |
| | | | 248/188.8 |
| 8,590,108 B2 | 11/2013 | Baik et al. | |
| 8,944,529 B2 | 2/2015 | Chen et al. | |
| 2006/0171110 A1 | 8/2006 | Li | |
| 2009/0261214 A1 * | 10/2009 | Beauchamp | G06F 1/181 |
| | | | 248/74.1 |
| 2009/0268396 A1 * | 10/2009 | Tang | G06F 1/166 |
| | | | 361/679.55 |
| 2010/0020490 A1 | 1/2010 | Lin | |
| 2012/0025680 A1 | 2/2012 | Lu | |
| 2012/0236488 A1 | 9/2012 | Wallace et al. | |
| 2012/0236494 A1 | 9/2012 | Wallace et al. | |
| 2015/0195946 A1 | 7/2015 | Kelaher et al. | |
| 2016/0014917 A1 | 1/2016 | Kelaher et al. | |
| 2016/0066468 A1 | 3/2016 | Smith et al. | |

OTHER PUBLICATIONS

Frachtenberg et al, "High-Efficiency Server Design", SC'11 Proceedings of 2011 International Conference for High Performance Computing, Networking, Storage and Analysis, 2011, pp. 1-11.
Restriction Requirement from U.S. Appl. No. 14/148,540, dated Jul. 27, 2015.
Kelaher et al., U.S. Appl. No. 14/148,540, filed Jan. 6, 2014.
Non-Final Office Action from U.S. Appl. No. 14/148,540, dated Feb. 12, 2016.
Non-Final Office Action from U.S. Appl. No. 14/148,540, dated Sep. 23, 2016.
Final Office Action from U.S. Appl. No. 14/148,540, dated Apr. 5, 2017.
Non-Final Office Action from U.S. Appl. No. 14/859,159, dated Nov. 8, 2016.
Notice of Allowance from U.S. Appl. No. 14/859,159, dated Jul. 20, 2017.
Notice of Allowance from U.S. Appl. No. 14/859,159, dated Aug. 21, 2017.
Non-Final Office Action from U.S. Appl. No. 14/859,159, dated Jan. 17, 2018.
Non-Final Office Action from U.S. Appl. No. 14/859,159, dated Aug. 3, 2018.
Final Office Action from U.S. Appl. No. 14/859,159, dated Jul. 3, 2018.
Final Office Action from U.S. Appl. No. 14/859,159, dated Jan. 30, 2019.
Notice of Allowance from U.S. Appl. No. 14/859,159, dated Apr. 16, 2019.

* cited by examiner

LIFT HANDLES HAVING SAFETY INTERLOCKS FOR A RACK-MOUNTED ENCLOSURE

BACKGROUND

The present invention relates to information technology (IT) systems, and more particularly, to lift handles having safety interlocks for a rack-mounted enclosure.

Lift handles for rack-mounted IT equipment, such as servers and storage enclosures, are often located on sides of the equipment. While this provides an installer acceptable access to the handles, this configuration also provides several disadvantages.

Side handles that are used in the industry are sometimes removable with some latching features, or permanent which rotate from sides of the equipment. Removable handles are difficult to use because they force the installer to hold the weight of the system while removing the handle prior to the equipment being capable of sliding into the rack. Also, removable handles may be lost prior to the equipment being removed from the rack, which makes removal more difficult or impossible.

Permanently attached rotating handles always stay with the equipment; however, they also produce problems when the system has to be slid back into a rack on fixed rails. When the system is slid back into the rack, the location of the handles to the side of the chassis may cause the hands of the installer to contact the rack door or the front edge of the rack during installation, which may be quite painful for the installer and/or cause the installer to lose control of the equipment, which may lead to damage to the equipment. Additionally, the handles are always available to an installer, regardless of whether the installer should utilize the handles or not to lift the equipment, for example when the equipment is too heavy to be lifted safely with the handles.

SUMMARY

According to one embodiment, a system includes an enclosure configured to be removable from a rack system, the enclosure including at least one bay for insertion of a component therein, a horizontally-oriented upper wall, a horizontally-oriented lower wall, two vertically-oriented sidewalls coupled to the upper and lower walls, and a set of integrated handles, each handle being configured to transition from a recessed position to an extended position, and each handle being configured to be gripped by a hand when in the extended position, wherein each handle is configured to extend higher than the upper wall of the enclosure when in the extended position. Each handle is configured to retract to within an outer profile of the enclosure when in the recessed position. Each handle is configured to rotate 180° from the recessed position to the extended position.

Other aspects and embodiments of the present invention will become apparent from the following detailed description, which, when taken in conjunction with the drawings, illustrates by way of example the principles of the invention.

DETAILED DESCRIPTION

Figure 1:
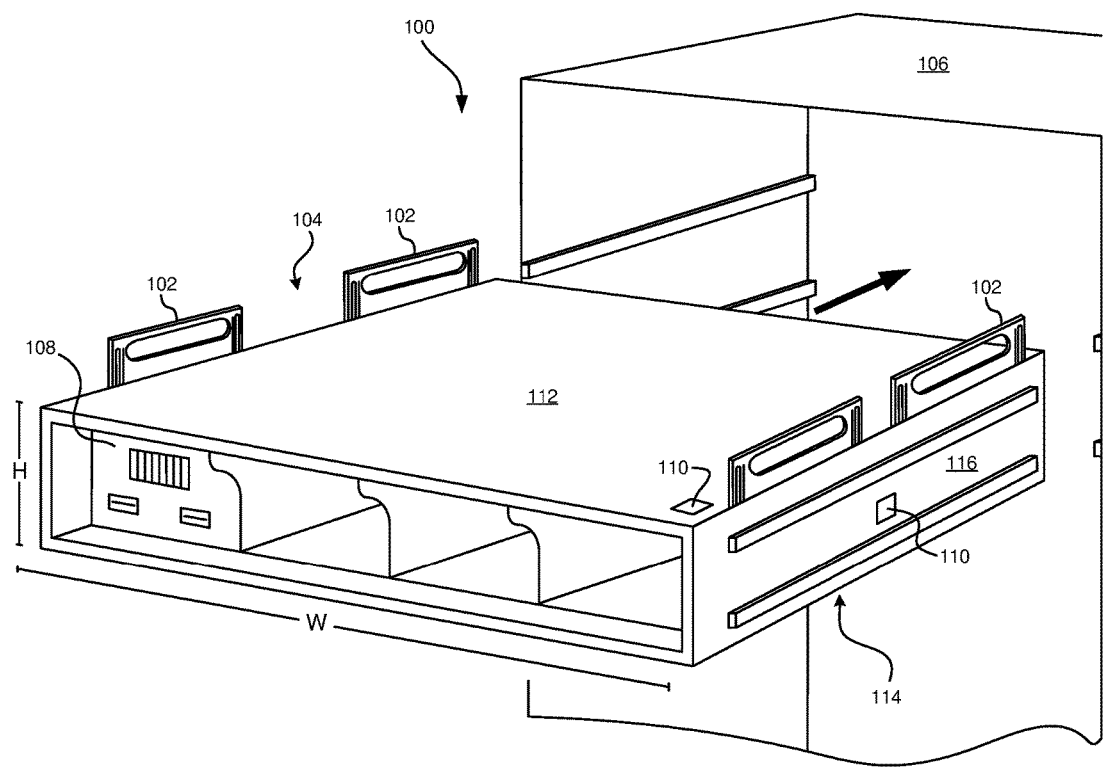
FIG. 1 shows a schematic of a system having an enclosure with an integrated set of lift handles, in accordance with one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an," and "the" include plural referents unless otherwise specified.

In order to overcome the problems associated with conventional information technology (IT) equipment, an improved handle system may be provided that restricts the use of the handle system to only when it is safe to lift an enclosure and provides better placement of the handles.

According to one general embodiment, a system includes an enclosure configured to be removable from a rack system, the enclosure including at least one bay for insertion of a component therein, a horizontally-oriented upper wall, a horizontally-oriented lower wall, two vertically-oriented sidewalls coupled to the upper and lower walls, and a set of integrated handles, each handle being configured to transition from a recessed position to an extended position, and each handle being configured to be gripped by a hand when in the extended position, wherein each handle is configured to extend higher than the upper wall of the enclosure when in the extended position, and wherein each handle is configured to retract to within an outer profile of the enclosure when in the recessed position.

According to another general embodiment, an enclosure includes at least one bay for insertion of a component therein, a horizontally-oriented upper wall, a horizontally-oriented lower wall, two vertically-oriented sidewalls coupled to the upper and lower walls, four integrated handles, each handle being located near corners of the upper wall of the enclosure and configured to transition from a recessed position to an extended position, one or more catches, each catch being associated with at least one of the handles and configured to release the one or more associated handles, and one or more interlocks, each interlock being physically configured to prevent transition of one or more handles associated therewith from the recessed position to the extended position when a component is installed in at least one bay of the enclosure, wherein the at least one of the handles is restricted from transitioning from the recessed position to the extended position until the associated catch is engaged, wherein each handle is configured to be gripped by a hand when in the extended position, wherein two of the handles are positioned within or on an exterior of each of the vertically-oriented sidewalls of the enclosure when in the recessed position, wherein each handle is configured to extend higher than the upper wall of the enclosure when in the extended position, and wherein each handle is configured to retract to within an outer profile of the enclosure when in the recessed position.

Now referring to FIG. 1, a schematic diagram of a system 100 is shown, according to one embodiment. The system 100 comprises an enclosure 104 or chassis. The enclosure 104 comprises at least one bay for insertion of a component 108 therein, a horizontally-oriented upper wall 112, a horizontally-oriented lower wall 114, two vertically-oriented sidewalls 116 coupled to the upper and lower walls, and a set of integrated lift handles.

Each lift handle 102 is positioned where it can be accessed by an installer, such as toward a corner of the enclosure 104. Toward a corner indicates as close to the corner of the upper surface of the enclosure as possible given design constraints, such as wall thickness, component bay configurations, etc. Also, each handle 102 is configured to extend higher than the upper wall 112 of the enclosure 104 when in the extended position. The set of integrated lift handles may include two handles 102, four handles 102, or possibly more handles for enclosures 104 which are designed for use with heavier components 108 and/or modules. A set having four handles 102 is a preferred embodiment, with each handle 102 being located near to or as close to a corner of the enclosure 104 as possible considering the design of the enclosure 104. By "near to" what is meant is that the handle is positioned closer to the corner than to a center of the wall on which it is placed.

Each handle 102 is collapsible, foldable, retractable, or in some other way capable of being recessed into an outer profile of the enclosure 104 when the enclosure 104 is to be mounted in a rack system 106 or some other suitable cabinet, system case, etc., e.g., each handle 102 is configured to retract to within an outer profile of the enclosure 104 when the handle 102 is in the recessed position. Furthermore, in some approaches, the handles 102 do not extend beyond side walls of the enclosure 104 such that the handles 102 are allowed to be in the extended position while the enclosure 104 is being installed into the rack system 106. This is particularly useful when there are no other devices positioned above the one being installed so that the handles 102 may be utilized to support the enclosure 104 during the installation process.

The outer profile of the enclosure 104 may be defined as a maximum possible side-to-side width W and/or top-to-bottom height H of the enclosure 104 that allows for the enclosure 104 to fit into a stall or bay of the rack 106. In this way, it is not necessary that the handles 102 completely retract from view and into the rack 106, but just that they are recessed sufficiently to allow insertion into the rack 106.

In one embodiment, four handles 102 are located near corners of the upper wall of the enclosure 104, with two handles 102 being positioned within or on an exterior of each of the vertically-oriented sidewalls of the enclosure 104 when in the recessed position.

In one embodiment, each handle 102 vertically-slide along an exterior wall of the enclosure 104 such that it protrudes from a top of the enclosure 104 on sides thereof.

In a further embodiment, the handles 102 may be spring-loaded (or otherwise biased toward an extended position as opposed to a recessed position) such that releasing a catch 110 or release button causes one or more of the handles 102 in the set to extend from the recessed position (where the handles 102 are recessed into the outer profile of the enclosure 104 for placement in the rack 106) to the extended position (where the handles 102 may be used for lifting and positioning of the enclosure 104). The release button is configured to disengage a catch upon being depressed in order to release one or more corresponding handles 102.

Accordingly, the enclosure 104 may further include one or more catches 110, each catch 110 being associated with at least one of the handles 102 and configured to release the one or more associated handles 102. Furthermore, the one or more associated handles 102 are restricted from transitioning from the recessed position to the extended position until the associated catch 110 is disengaged, such as by pressing, sliding, pushing, pulling, or some other suitable action.

A handle 102 is restricted from transitioning from the recessed position to the extended position until an associated catch 110 is disengaged in one embodiment. When the handles 102 are spring-loaded, they may be pressed back into the recessed position through physical force thereon in a direction toward the enclosure 104, which is an opposite direction from which they extended from the enclosure 104. In another embodiment, when the handles 102 are in the extended position, they may be pressed back into the recessed position through physical force thereon in a direction opposite a direction in which they moved to extend, such as by flipping them back, rotating them back, etc., depending on how the handles 102 were extended.

In one embodiment, each handle 102 may have a catch 110 associated therewith, each associated catch 110 being positioned near to the recessed position of one handle 102 on an exterior of the upper wall or an exterior of one of the vertically-oriented sidewalls of the enclosure 104. By "near" what is meant is that it is located closer to the associated handle 102 than to other elements of the enclosure 104, such as other handles 102, interlocks, bays, etc. Furthermore, disengaging a catch 110 releases the associated handle 102 for transition from the recessed position to the extended position.

Furthermore, the handles 102 may be positioned in the recessed position for any reason, including shipping and for installation into the rack 106.

The one or more catches 110 may be positioned on an exterior surface of the enclosure 104 at any location where they are able to be accessed by an installer, such as on a sidewall, exterior surface of the upper wall, and/or rear end of the exterior of the enclosure 104 facing away from the rack 106. In an alternate embodiment, the one or more catches 110 may be positioned on an interior surface (near bays for installation of components 108 therein) of the enclosure 104 at any location where they are able to be accessed by an installer, such as on a sidewall, upper surface, and/or lower surface of an interior of the enclosure 104. In this embodiment, one or more components 108 must be removed prior to being able to access at least one catch 110 for deployment of at least one handle 102, which may force an installer to remove components 108 prior to installation and/or removal of the enclosure 104 into/from the rack 106.

In another embodiment, the one or more catches 110 may be positioned on one or more sidewalls of the enclosure 104 close (within 5 inches) to a rear end of the enclosure 104 facing away from the rack 106 when installed. In this way, two handles 102 positioned at an extreme rear end of the enclosure 104 on or within the vertically-oriented sidewalls of the enclosure 104 may be deployed by disengaging the one or more catches 110 early in the removal process, thereby allowing the handles 102 to be used in the rest of the removal process, instead of simply gripping the exterior of the enclosure 104. This provides immediate access to the handles 102 upon beginning to remove the enclosure 104 from the rack 106.

The one or more catches 110 may be configured to transition the handles 102 upward or outward from the enclosure 104 from the recessed position to the extended position for use according to any conceivable transition, such as via flipping, rotating, extending, etc., and may be aided by biasing of the handles 102 toward the extended position, such as via a conventional spring, spring-leaf arrangement, gear system, ratchet system, etc.

Figure 2:
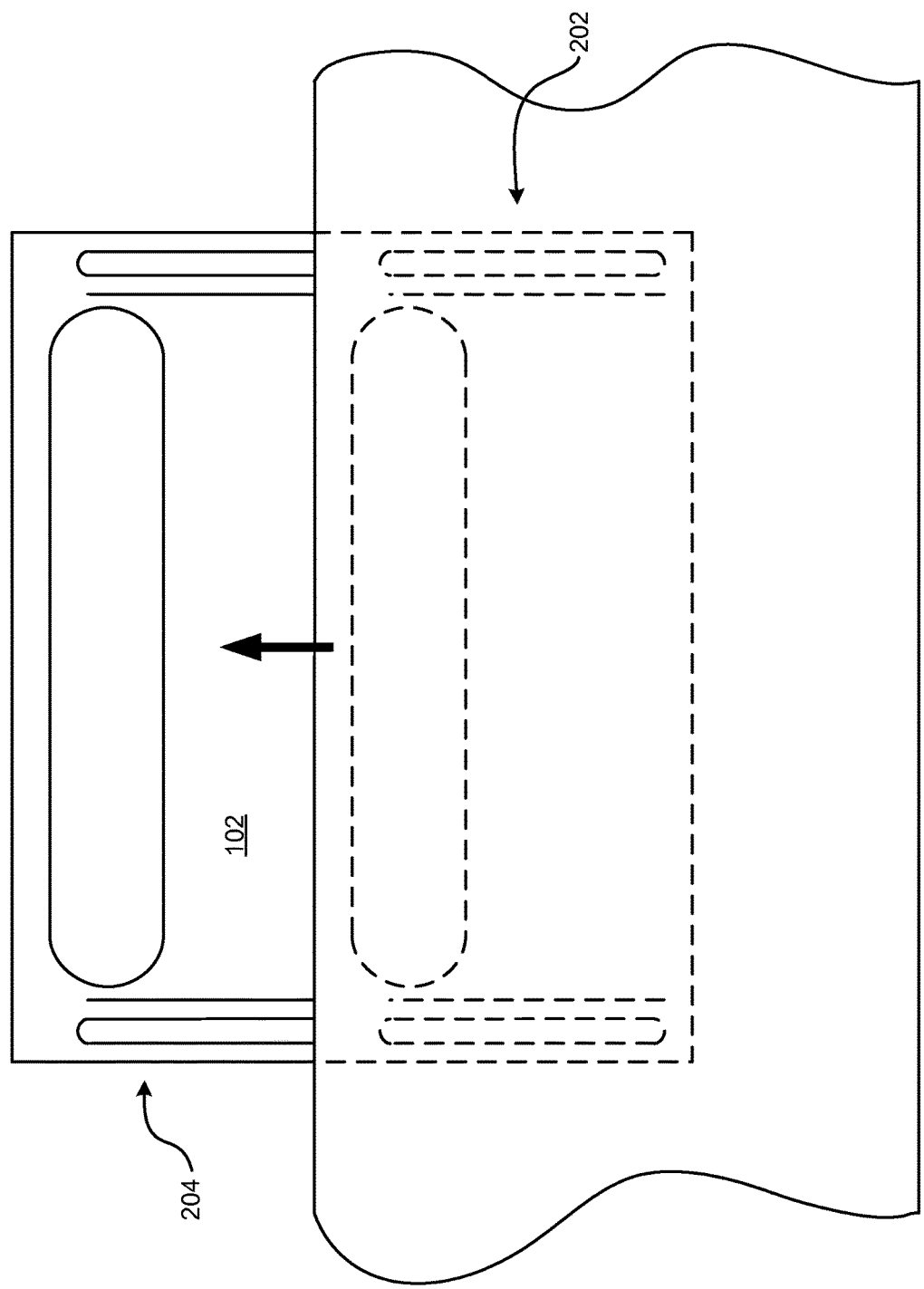
FIG. 2 shows a side view of a handle transitioning from a recessed position to an extended position, in accordance with one embodiment.

In one embodiment, as shown in FIG. 2, one or more of the handles 102 may extend vertically along one of the vertically-oriented sidewalls of the enclosure 104 when transitioning from the recessed position 202 to the extended position 204. These handles 102 may have a slim profile in the width direction so that they do not occupy much space in the enclosure 104 when in the recessed position 202, which may cause the enclosure 104 to lose space capable of storing more components 108 therein. In the extended position 204, the handles 102 extend upward from the enclosure 104 such that they may be grasped by an installer's hands.

In another embodiment, the handles 102 may have a conventional profile suitable for grasping with hands, and may be located about the enclosure 104 at a position where they do not interfere with placement of components 108 therein.

The handles 102 may comprise any suitable material which has a sufficient strength for supporting the weight of the enclosure 104 assuming that the enclosure 104 is completely filled with components. For example, the handles 102 may comprise a metal, a composite, a plastic, or some combination thereof. Exemplary metals include carbon and alloys thereof (machined) such as steel, aluminum and alloys thereof (cast or machined), magnesium and alloys thereof, titanium and alloys thereof (cast or machined), etc. Other materials may include carbon fiber, resin composite materials, etc.

Figure 3A:
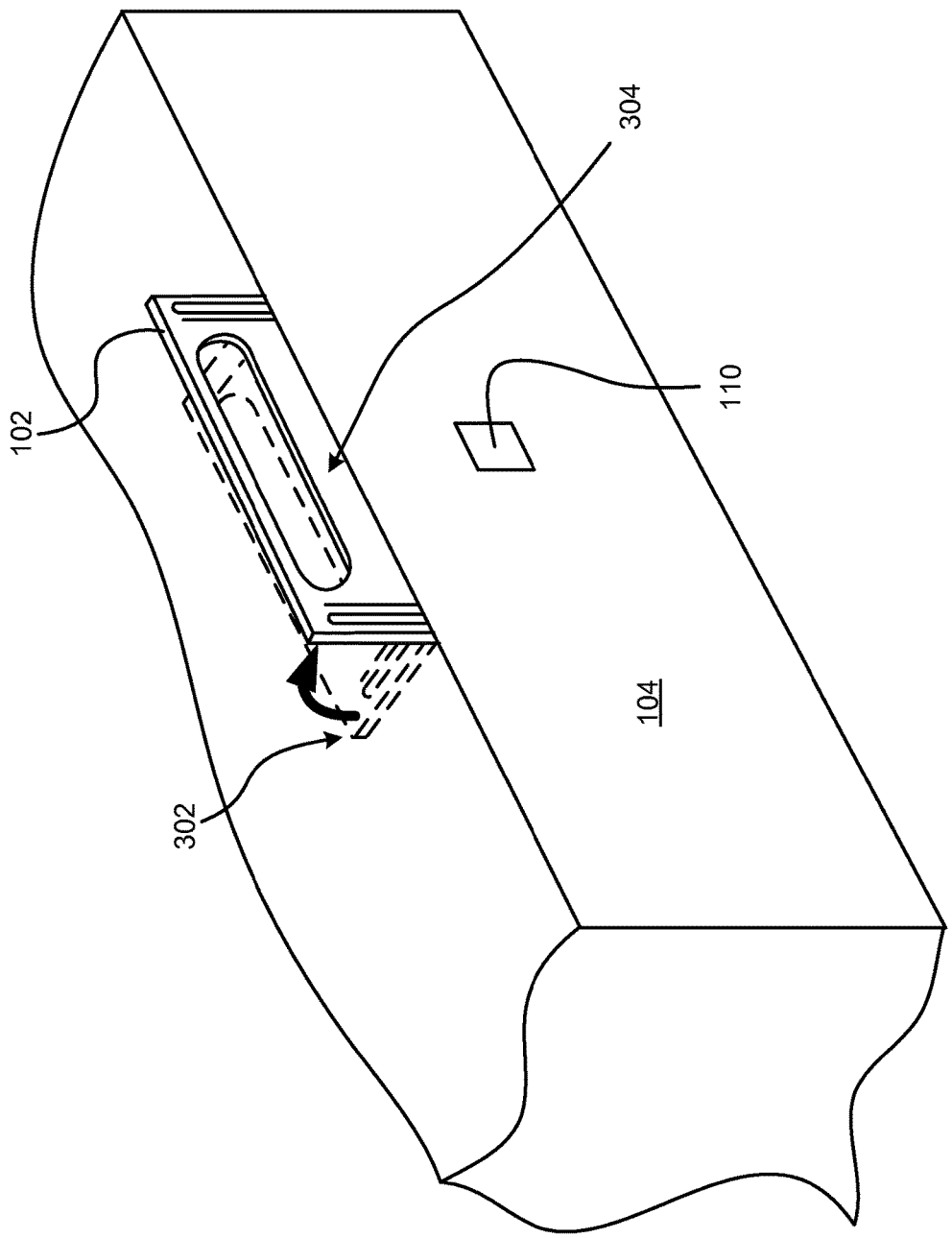
FIG. 3A shows an isometric view of a handle transitioning from a recessed position to an extended position, in accordance with one embodiment.
Figure 3B:
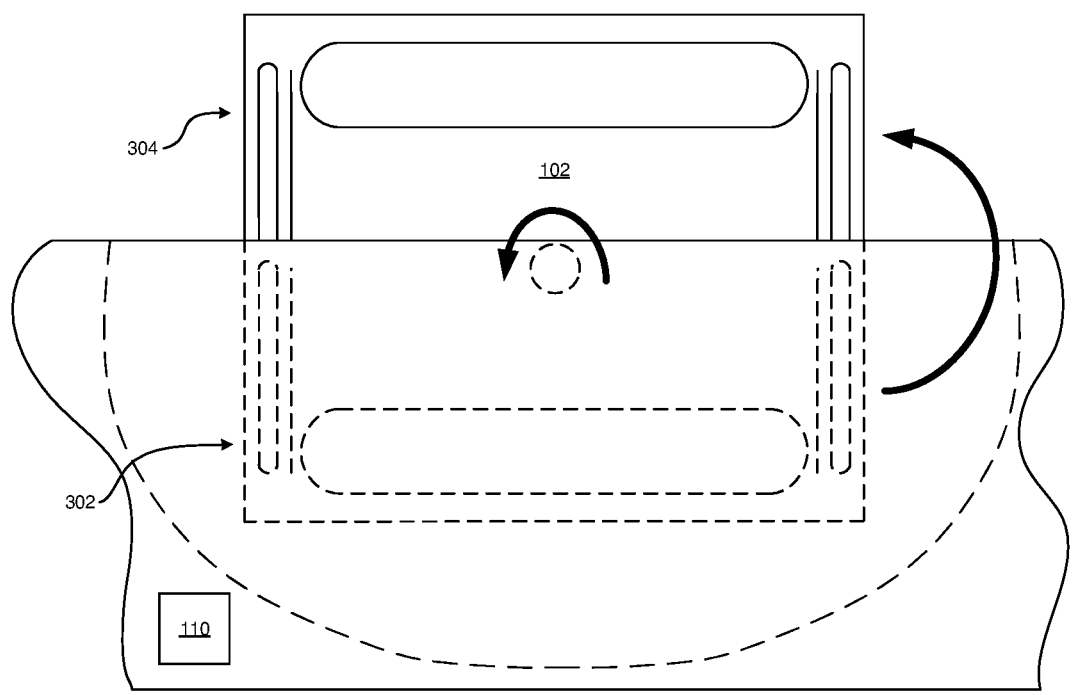
FIG. 3B shows a side view of a handle transitioning from a recessed position to an extended position, in accordance with one embodiment.
Figure 3C:
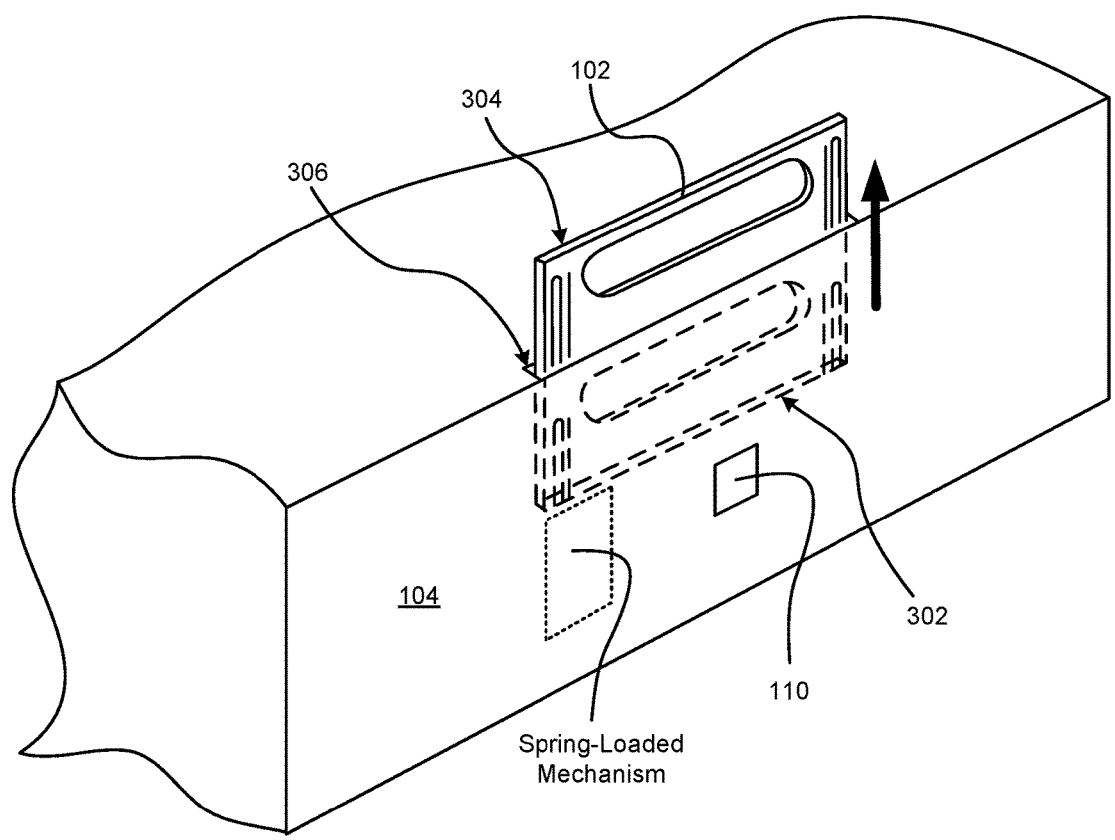
FIG. 3C shows an isometric view of a handle transitioning from a recessed position to an extended position, in accordance with one embodiment.

In an alternate embodiment, as shown in FIGS. 3A-3B, one or more of the handles 102 may flip out or rotate from sides of the enclosure 104. These handles 102 may be positioned upside-down when in the recessed position 302, and then flip upward (not shown), rotate 180° (as shown in FIG. 3B) into the right-side up position for use in the extended position 304, be positioned sideways on an upper surface of the enclosure 104 and then flip upward (as shown in FIG. 3A), be positioned right side up in a slot 306 of the enclosure 104 and then slide or extend upward (as shown in FIG. 3C), etc. In all of these embodiments, an installer may need to disengage the one or more catches 110 prior to the handles 102 being deployed into the extended position 304. Furthermore, the one or more catches 110 may operate a biasing of the handles 102 which deploys them automatically (such as via a spring-loaded mechanism) upon disengaging the one or more catches 110, or the handles 102 may simply be released so that they may be manually extended into position for use.

The handles 102 allow for better grip when lifting the enclosure 104 out of any packaging in which it is shipped and/or stored since an installer's hands are not being interfered with by any packaging located to the side of the enclosure 104 when lifting the enclosure 104 up and out of the packaging.

Figure 4A:
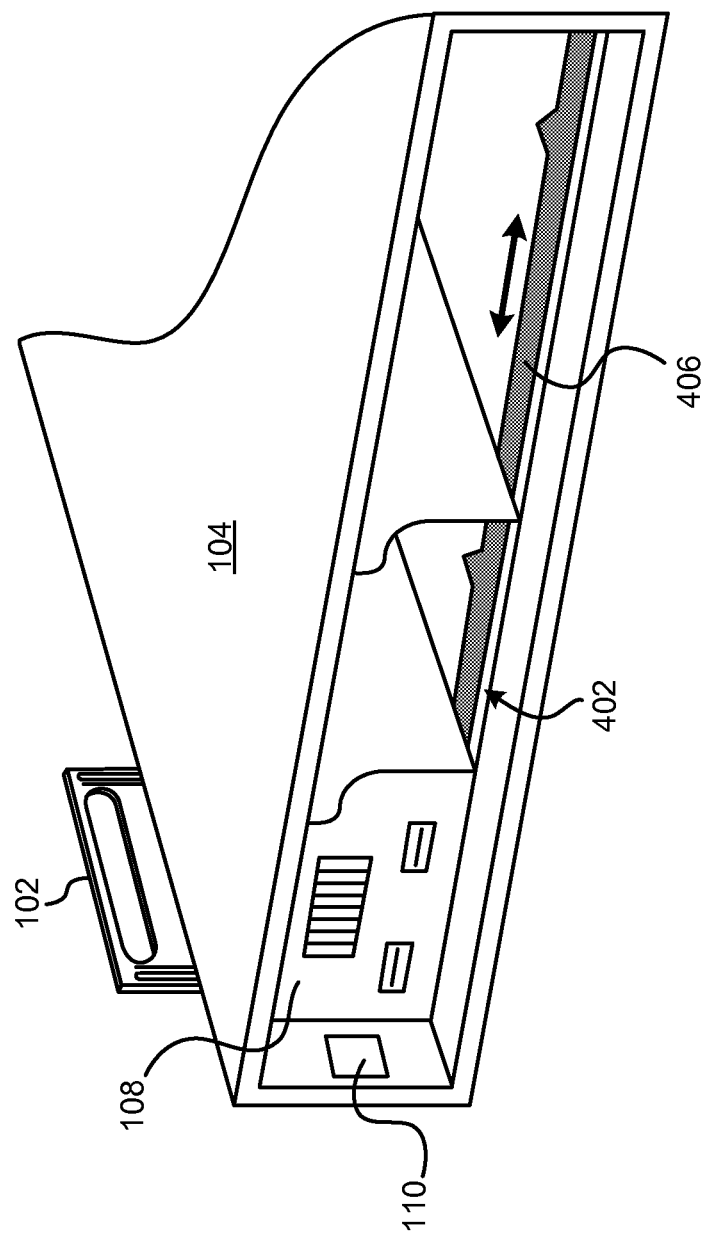
FIG. 4A shows a partial view of an enclosure having an interlock system, according to one embodiment.

Furthermore, as shown in FIG. 4A, an internal interlock system 402 may be physically configured to prevent the handles 102 from being deployed into the extended position when there are components 108 installed within the enclosure 104. In this embodiment, the enclosure 104 comprises one or more interlocks (such as in an interlock system 402), each interlock or latch 406 preventing transition of one or more handles 102 associated therewith from the recessed position to the extended position when a component 108 is installed in at least one bay of the enclosure 104.

This interlock system 402 may be integrated with the catch 110 that prevents release of the handles 102, such that the interlock system 402 may prevent the catch 110 from being disengaged. The interlock system 402 may be positioned near to the location of one or more of the handles 102 (closer to the handle 102 than to other elements of the enclosure 104), at a location within one or more bays of the enclosure 104, on a panel or surface of the enclosure 104, etc. The interlock system 402 comprises a mechanism that is configured to be actuated when a component is installed in at least one of bay of the enclosure 104, and may be of a type known in the art.

In one embodiment, as shown in FIG. 4A, an integrated interlock system 402 may rely on a single latch 406 which causes the interlock system 402 to prevent deployment of any of the handles 102 when any component 108 is installed in the enclosure 104. In another embodiment, multiple latches 406 may be present within one or more bays of the enclosure 104, and may prevent deployment of a handle 102 associated with the bay in which the latch 406 is installed. This is intended to prevent deployment of the associated handle 102 to the extended position when any component 108 is installed in a bay associated with a latch 406 in the enclosure 104. However, removal of one, several, or all components 108 from associated bays allows one or more associated handles 102 to be deployable. In another embodiment, the single latch 406 may slide sideways when a component 108 is inserted into the enclosure 104 into a position which restricts any of the handles 102 from being deployed. In other embodiments, the single latch 406 may move upward, downward, into, or out from the enclosure 104 when a component is inserted therein.

Figure 4B:
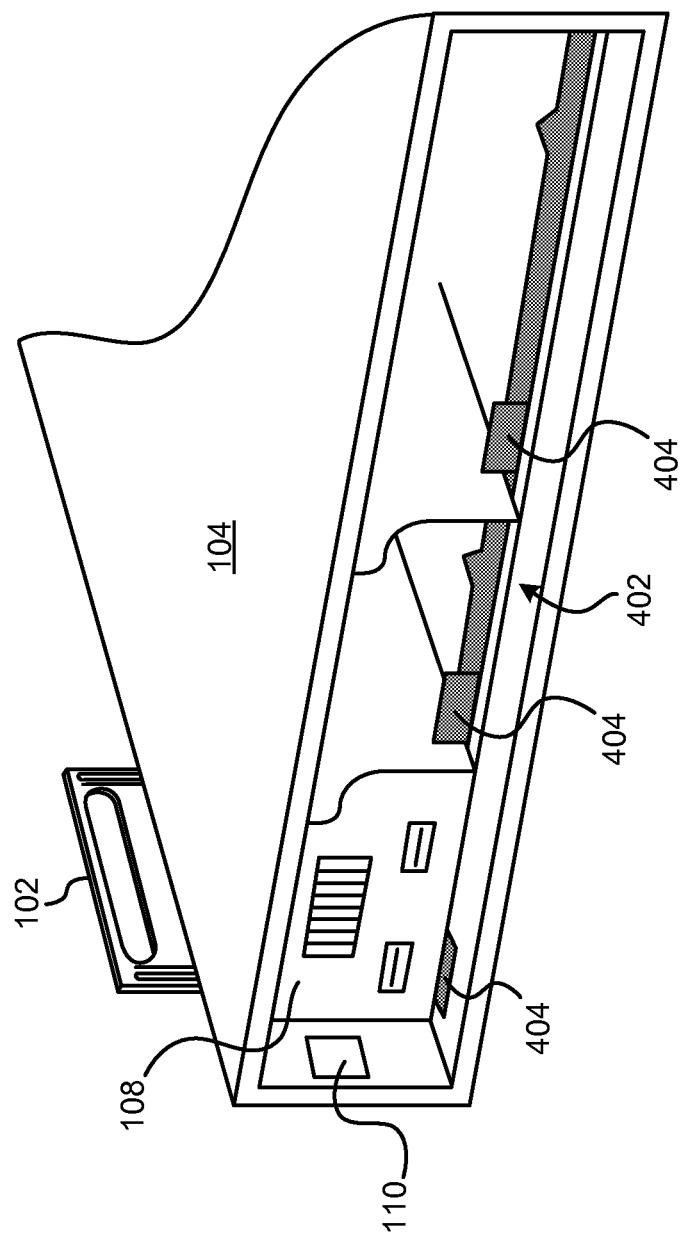
FIG. 4B shows a partial view of an enclosure having an interlock system, according to one embodiment.

In yet another embodiment, as shown in FIG. 4B, the interlock system 402 may comprise individual latches 404 for each bay of the enclosure 104, with each individual latch 404 being separately releasable (so that an associated handle 102 may be deployed) upon a component 108 being removed from the bay associated with the individual latch 404. In another embodiment, each of the individual latches 404 may need to be released prior to any of the handles 102 being deployed. The interlock system 402 may communicate with the one or more catches 110 such that the interlock system 402 may prevent disengaging the catch 110 when any component 108 is installed in the enclosure 104.

In another embodiment, one interlock or latch 404 is associated with each bay of the enclosure 104 with each interlock or latch 404 being configured to prevent transition of at least one handle 102 from the recessed position to the extended position when a component 108 is installed in the associated bay of the enclosure 104.

In any of the embodiments described herein, the interlock system 402, interlock 404, and/or interlock 406 may comprise armatures, sliders, sliding bars, latches, tabs, and any other members suitable for enabling the interlock system 402 to restrict extension of one or more of the handles 102 when a component 108 is stored in the enclosure 104. Furthermore, the interlock system 402 may be of any type that would be known to one of skill in the art upon reading the present disclosure.

Figure 5A:
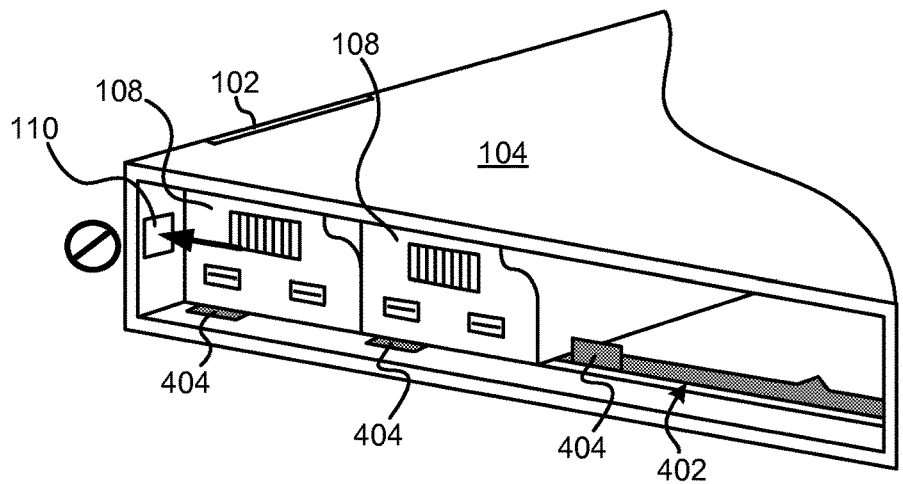
FIGS. 5A-5C show a process for transitioning at least one of the handles from a recessed position to an extended position in an enclosure having an interlock system, according to one embodiment.
Figure 5B:
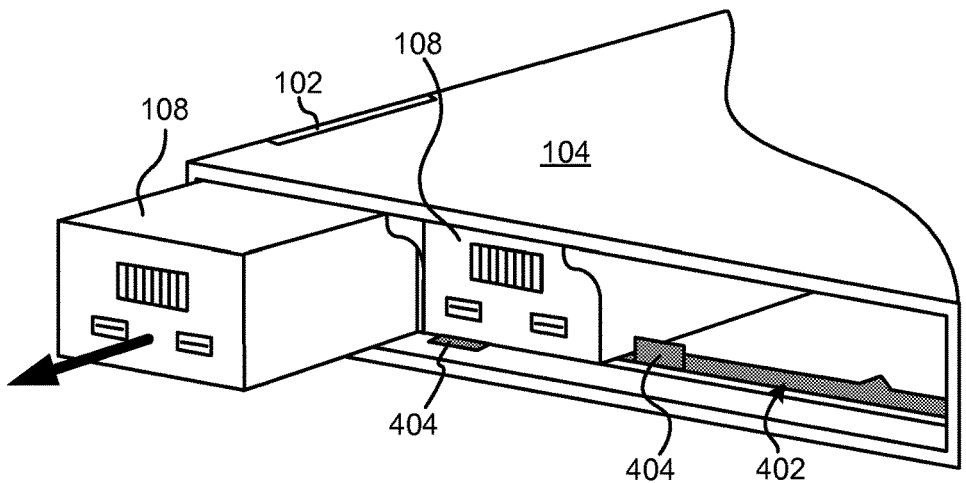
Figure 5C:
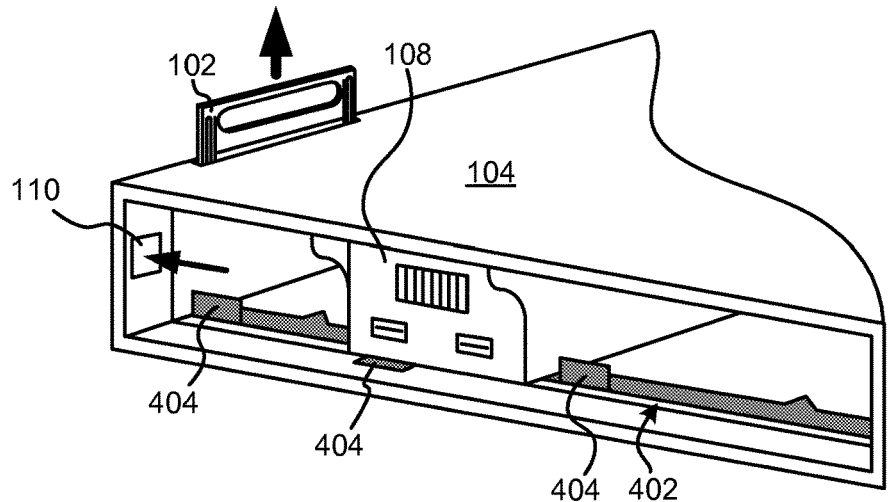

Now referring to FIGS. 5A-5C, a process for transitioning at least one of the handles 102 from a recessed position to an extended position in an enclosure 104 having an interlock system 402 is shown, according to one embodiment. As shown in FIG. 5A, when a component 108 is installed in the enclosure 104 in a bay which is associated with a catch 110, this catch 110 (and possibly more catches 110) are not able to be actuated to extend the handle 102 because the interlock system 402, and specifically one or more of the interlocks or latches 404, are still engaged by one or more of the installed components 108.

FIGS. 5A-5C illustrate this process when removal of one component 108 causes one catch 110 to become capable of being actuated; however, in other approaches, one, some, or all components 108 may need to be removed prior to actuation of one or more catches 110 becoming possible.

As shown in FIG. 5B, removal of the component 108 closest to the catch 110 is performed, thereby freeing up the bay adjacent to the catch 110 and disengaging the interlock or latch 404.

Then, as shown in FIG. 5C, the catch 110 is now capable of being actuated. The actuation of the catch 110 releases one or more handles 102 (only one handle 102 is shown, but as described previously multiple handles 102 and/or multiple catches 110 may be present). As shown, the middle component 108 is still present; however, removal of all components 108 may be required to actuate the one or more catches 110 in some approaches. In these approaches, the one or more handles 102 would not be able to be extended when this component 108 was still installed in the enclosure 104, regardless of how many other components 108 were removed.

According to one embodiment, a handle system may be provided that allows an installer's hands to be positioned closer to the center of the enclosure as opposed to near the edges. Also, most conventional handles are available at any time to the installer, regardless of the weight that is loaded into the enclosure. To date, no handle systems known in the industry have an interlock that prevents the enclosure's lift handles from being accessed when there is excessive weight in the enclosure. Accordingly, several advantages are provided by the handle systems described herein according to various embodiments.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. An apparatus, comprising:
an enclosure physically structured to be removable from and operable within a rack system, the enclosure comprising:
a horizontally-oriented upper wall;
a horizontally-oriented lower wall;
two vertically-oriented sidewalls extending between the upper and lower walls;
at least one bay comprising a front opening defined along front ends of the horizontally-oriented upper wall, the horizontally-oriented lower wall, and the two vertically-oriented sidewalls, the front opening being configured to receive a component therethrough and into the bay; and
a set of integrated handles numbering more than one, each handle being configured to transition from a recessed position to an extended position, and each handle being configured to be gripped by a hand when in the extended position,
wherein each handle is configured to extend higher than the upper wall of the enclosure when in the extended position,
wherein each handle is configured to retract to within an outer profile of the enclosure when in the recessed position,
wherein each handle is configured to rotate 180° from the recessed position to the extended position about an axis, the axis being oriented normal to a closest of the vertically-oriented sidewalls to the handle,
wherein each handle is configured to rotate 180° from the recessed position to the extended position about a hub positioned along the axis, the hub being located midway along a lower portion of the handle, and
wherein each handle is oriented upside down when in the recessed position.

2. The apparatus as recited in claim 1, wherein the enclosure comprises four handles in total, each of the handles being located near corners of the upper wall of the enclosure,
wherein a first handle of the four handles is positioned within a first vertically-oriented sidewall of the two vertically-oriented sidewalls of the enclosure when in the recessed position, and
wherein a second handle of the four handles is positioned within a second vertically-oriented sidewall of the two vertically-oriented sidewalls of the enclosure when in the recessed position.

3. The apparatus as recited in claim 1, wherein the enclosure comprises four handles, each of the four handles being located near a different corner of the upper wall of the enclosure.

4. The apparatus as recited in claim 1, wherein the outer profile of the enclosure is defined as a maximum possible side-to-side width and top-to-bottom height of the enclosure that allows for the enclosure to fit into a stall of the rack system.

5. The apparatus as recited in claim 1, wherein two handles of the set of handles are positioned at an extreme rear end of the enclosure within the vertically-oriented sidewalls of the enclosure when in the recessed position to provide immediate access to the two handles when in the extended position upon beginning to remove the enclosure from the rack system.

6. An apparatus, comprising:
an enclosure physically structured to be removable from and operable within a rack system, the enclosure comprising:
at least one bay for insertion of a component therein;
a horizontally-oriented upper wall;
a horizontally-oriented lower wall;
two vertically-oriented sidewalls coupled to the upper and lower walls;
at least one bay comprising a front opening defined along front ends of the horizontally-oriented upper wall, the horizontally-oriented lower wall, and the two vertically-oriented sidewalls, the front opening being configured to receive a component therethrough and into the bay;

four integrated handles, each handle being located near a different corner of the upper wall of the enclosure and configured to transition from a recessed position to an extended position, and each handle being configured to be gripped by a hand when in the extended position;

wherein each of the four handles swivels toward and extends from the upper wall of the enclosure in transitioning to the extended position; and wherein each handle is configured to extend higher than the upper wall of the enclosure when in the extended position, each handle is configured to retract to within an outer profile of the enclosure when in the recessed position, each handle is configured to rotate 180° from the recessed position to the extended position, and each handle is oriented upside down when in the recessed position.

7. The apparatus as recited in claim 6, wherein each of the handles is located near corners of the upper wall of the enclosure.

8. The apparatus as recited in claim 6, wherein the outer profile of the enclosure is defined as a maximum possible side-to-side width and top-to-bottom height of the enclosure that allows for the enclosure to fit into a stall of the rack system.

9. The apparatus as recited in claim 6, wherein two handles of the four handles are positioned at an extreme rear end of the enclosure within the vertically-oriented sidewalls of the enclosure when in the recessed position to provide immediate access to the two handles when in the extended position upon beginning to remove the enclosure from the rack system.

* * * * *